(12) United States Patent
Arakane et al.

(10) Patent No.: US 7,879,465 B2
(45) Date of Patent: *Feb. 1, 2011

(54) ORGANIC ELECTRIC-FIELD LIGHT-EMITTING ELEMENT

(75) Inventors: Takashi Arakane, Sodegaura (JP); Kenichi Fukuoka, Sodegaura (JP); Chishio Hosokawa, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/846,126

(22) Filed: Jul. 29, 2010

(65) Prior Publication Data

US 2010/0308315 A1   Dec. 9, 2010

Related U.S. Application Data

(63) Continuation of application No. 11/178,456, filed on Jul. 12, 2005, which is a continuation of application No. 10/111,667, filed as application No. PCT/JP01/07729 on Sep. 6, 2001, now Pat. No. 6,929,871.

(30) Foreign Application Priority Data

Sep. 7, 2000   (JP) .............................. 2000-271707

(51) Int. Cl.
    *H01L 51/54*   (2006.01)
(52) U.S. Cl. .................. 428/690; 428/917; 313/504; 313/506
(58) Field of Classification Search .................. None
    See application file for complete search history.

(56) References Cited

U.S. PATENT DOCUMENTS 5,503,910 A   4/1996   Matsuura et al.

(Continued)

FOREIGN PATENT DOCUMENTS

EP   740489 A1   10/1996

(Continued)

OTHER PUBLICATIONS

Thin Solid Films, 363 (2000), p. 290-293.

(Continued)

*Primary Examiner*—Dawn Garrett
(74) *Attorney, Agent, or Firm*—Oblon, Spivak, McClelland, Maier & Neustadt, L.L.P.

(57) ABSTRACT

In an organic electroluminescent element comprising an anode layer, an organic luminescent layer, an inorganic compound layer (or reductive dopant layer) and a cathode layer; the organic luminescent layer comprises an aromatic amine compound of a formula (1), and/or an aromatic amine compound of a formula (2)

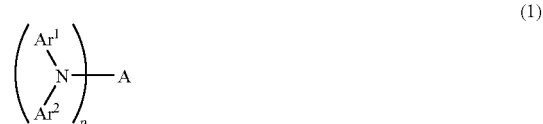

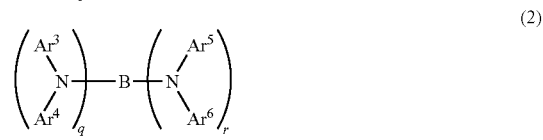

wherein A, B, and $Ar^1$ to $Ar^6$ are independently a $C_{6-60}$ aromatic group which does not contain a styryl group nor an alkenyl group, at least one of A, $Ar^1$, $Ar^2$, or B, $Ar^3$ to $Ar^6$ contains at least three condensed aromatic rings, and p, q and r of a condensation number are an integer of 1 to 6. The element has significantly long half-life and high luminance even at low driving voltages.

5 Claims, 1 Drawing Sheet

102 : organic EL element
16 : cathode layer
22 : reductive dopant layer
12 : organic luminescent layer
10 : anode layer

U.S. PATENT DOCUMENTS

| | | | |
|---|---|---|---|
| 5,776,622 | A | 7/1998 | Hung et al. |
| 5,776,623 | A | 7/1998 | Hung et al. |
| 5,811,834 | A | 9/1998 | Tamano et al. |
| 5,909,081 | A | 6/1999 | Eida et al. |
| 5,935,721 | A | 8/1999 | Shi et al. |
| 5,972,247 | A | 10/1999 | Shi et al. |
| 6,248,458 | B1 | 6/2001 | Yoon et al. |
| 6,284,393 | B1 | 9/2001 | Hosokawa et al. |
| 6,396,209 | B1 | 5/2002 | Kido et al. |
| 6,416,888 | B1 | 7/2002 | Kawamura et al. |
| 6,509,109 | B1 | 1/2003 | Nakamura et al. |
| 6,558,817 | B1 | 5/2003 | Ueda et al. |
| 6,743,948 | B1 | 6/2004 | Hosokawa et al. |
| 6,929,871 | B2 * | 8/2005 | Arakane et al. ............ 428/690 |
| 2002/0004146 | A1 | 1/2002 | Kido et al. |

FOREIGN PATENT DOCUMENTS

| | | | |
|---|---|---|---|
| EP | 0 765 106 | A2 | 3/1997 |
| EP | 0 855 848 | A2 | 7/1998 |
| EP | 0 936 844 | A2 | 8/1999 |
| EP | 0949696 | A2 | 10/1999 |
| EP | 1009198 | A1 | 6/2000 |
| EP | 1061112 | A1 | 12/2000 |
| JP | 2-139893 | | 5/1990 |
| JP | 2-196475 | | 8/1990 |
| JP | 6-330032 | | 11/1994 |
| JP | 8-311442 | | 11/1996 |
| JP | 09-157643 | | 6/1997 |
| JP | 10-72579 | A | 3/1998 |
| JP | 10-72580 | A | 3/1998 |
| JP | 10-72581 | A | 3/1998 |
| JP | 10-088120 | | 4/1998 |
| JP | 10-270171 | A | 10/1998 |
| JP | 11-307267 | | 11/1999 |
| JP | 11-329734 | | 11/1999 |
| JP | 2000-150161 | | 5/2000 |
| JP | 2000-164363 | | 6/2000 |
| WO | 00/39247 | | 7/2000 |

OTHER PUBLICATIONS

Synthetic Metals, vol. 11-112, (2000), p. 57-61.
Applied Physics Letters, vol. 77, No. 2, Jul. 10, 2000, p. 160-162.
Japanese Office Action issued Aug. 17, 2010 in corresponding Japanese Application No. 2002-525701.

* cited by examiner

ORGANIC ELECTRIC-FIELD LIGHT-EMITTING ELEMENT

CROSS REFERENCE TO RELATED APPLICATIONS

This application is a continuation of U.S. patent application Ser. No. 11/178,456, filed Jul. 12, 2005, which, in turn, is a continuation of U.S. patent application Ser. No. 10/111,667, which is the U.S. National Stage of International Application No. PCT/JP01/07729, filed Sep. 6, 2001, the disclosures of which are incorporated herein by reference in their entireties. This application claims priority to Japanese Patent Application No. 2000-271707, filed Sep. 7, 2000, the disclosure of which is incorporated herein by reference in its entirety.

TECHNICAL FIELD

The present invention relates to an organic electric-field light-emitting element (hereinafter referred to as an organic electroluminescent (EL) element) and, more particularly to an organic EL element suitably employed in display devices for personal and industrial use, light sources of printer heads and the like.

BACKGROUND ART

Japanese Patent Laid-open Nos. H2(1990)-139893, H2(1990)-196475 and H2(1990)-196475 disclose an organic EL element provided with an inorganic semiconductive thin layer and an organic luminescent layer between electrodes for easier injection of electrons and the like. In the organic EL element, an inorganic semiconductive thin layer is formed on an anode, and an organic luminescent layer and a cathode are further formed thereon, which inorganic semiconductive thin layer is made of an inorganic semiconductive material such as carbon, germanium, silicon, tin, silicon carbide, boron nitride, boron phosphide and gallium nitride.

Japanese Patent Laid-open Nos. H10(1998)-88120 and 2000-150161 disclose an organic EL element being of structure, positive hole injecting layer/luminescent layer/electron-injecting layer for improving its luminance (luminescent brightness). Amine materials capable of transporting positively charged holes (hereinafter referred to as positive holes) are used as a luminescent material, and tris(8-hydroxyquinolinate)aluminum (Alq), bis(2-methyl-8-hydroxyquinolinate)(p-cyanophenolate)gallium and the like are used in the electron-injecting layer.

However, in the organic EL elements disclosed by H2(1990)-139893 and H2(1990)-196475, the mobility of electrons injected from the cathode is relatively reduced by the inorganic semiconductive thin layer, resulting in a decrease in luminous efficiency. On other words, although electrons are desired to recombine with positive holes around the center of the organic luminescent layer for efficient luminescence, they may re-couple around the inorganic semiconductive thin layer, thereby losing luminescence or reducing the ratio of re-coupling. Consequently, the luminescence in the organic luminescent layer is decreased.

In the organic EL elements disclosed by H10(1998)-88120 and 2000-150161, the materials capable of injecting electrons such as Alq, which are used in the electron injecting layer, are liable to be degraded with shorter half-lives.

The inventors have made efforts to solve the above problems and then found that an organic EL element can be obtained of which luminance is higher even at low voltages, e.g., direct current 10V, and half-life is remarkably lengthened by certain structures. According to a first structure, an inorganic compound layer is provided between an organic luminescent layer and a cathode layer, and certain aromatic amine compounds are used in the organic luminescent layer. According to a second structure, a layer containing a reductive dopant (hereinafter referred to as a reductive dopant layer) is provided between an organic luminescent layer and a cathode layer, and certain aromatic amine compounds are used in the organic luminescent layer. According to a third structure, a certain electron injecting layer is provided between an organic luminescent layer and an anode, and certain aromatic amine compounds are used in the organic luminescent layer.

An object of the present invention is therefore to provide an organic EL element with high luminance even at low driving voltages, and with remarkable long half-life.

SUMMARY OF THE INVENTION

According to a first aspect of the present invention, an organic EL element is provided which comprises an anode layer, an organic luminescent layer, a cathode layer and an inorganic compound layer between the organic luminescent layer and the cathode layer. According to a second aspect of the present invention, an organic EL element is provided which comprises an anode layer, an organic luminescent layer, a cathode layer and a reductive dopant layer between the organic luminescent layer and the cathode layer. In these organic EL elements, the organic luminescent layers comprise an aromatic amine compound represented by the following formula (1) and/or an aromatic amine compound represented by the following formula (2).

According to a third aspect of the present invention, an organic EL element is provided which comprises an anode layer, an organic luminescent layer, a cathode layer and an electron injecting layer between the organic luminescent layer and the cathode layer. The electron injecting layer comprises a hydrocarbon compound with an anthracene nucleus or a fluoranthene nucleus. The energy gap of the compound is 2.7 eV or more. Further, the organic luminescent layer comprises an aromatic amine compound represented by the following formula (3) and/or an aromatic amine compound represented by the following formula (4).

That is, according to the first to third aspects, an organic EL element can be provided which contains as a luminescent material an aromatic amine compound with at least three condensed aromatic rings. Here "at least three condensed aromatic rings" means that at least three aromatic rings are condensed.

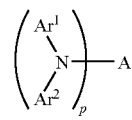
(1)

wherein A, $Ar^1$ and $Ar^2$ are independently a substituted or unsubstituted $C_{6-60}$ aromatic group which does not contain a styryl group nor an alkenyl group, at least one of A, $Ar^1$ and $Ar^2$ contains substituted or unsubstituted at least three condensed aromatic rings, and p of a condensation number is an integer of 1 to 6.

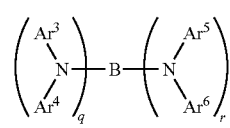
(2)

wherein B, $Ar^3$, $Ar^4$, $Ar^5$ and $Ar^6$ are independently a substituted or unsubstituted $C_{6-60}$ aromatic group which does not contain a styryl group nor an alkenyl group, at least one of B, $Ar^3$, $Ar^4$, $Ar^5$ and $Ar^6$ contains substituted or unsubstituted at least three condensed aromatic rings, and q and r of a condensation number are an integer of 1 to 6.

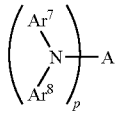

(3)

wherein A, $Ar^7$ and $Ar^8$ are independently a substituted or unsubstituted $C_{6-60}$ aromatic group, at least one of A, $Ar^7$ and $Ar^8$ contains substituted or unsubstituted at least three condensed aromatic rings, and p of a condensation number is an integer of 1 to 6.

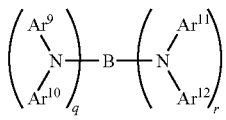

(4)

wherein B, $Ar^9$, $Ar^{10}$, $Ar^{11}$ and $Ar^{12}$ are independently a substituted or unsubstituted $C_{6-60}$ aromatic group, at least one of B, $Ar^9$, $Ar^{10}$, $Ar^{11}$ and $Ar^{12}$ contains substituted or unsubstituted at least three condensed aromatic rings, and q and r of a condensation number are an integer of 1 to 6.

In the aromatic amine compounds of the formulas (1) to (4), $Ar^1$ to $Ar^{12}$ may be the same as or different from each other, and preferably have 6 to 40 carbon atoms. A and B preferably contain substituted or unsubstituted at least three condensed aromatic rings

BEST MODE OF CARRYING OUT THE INVENTION

Figure 1:
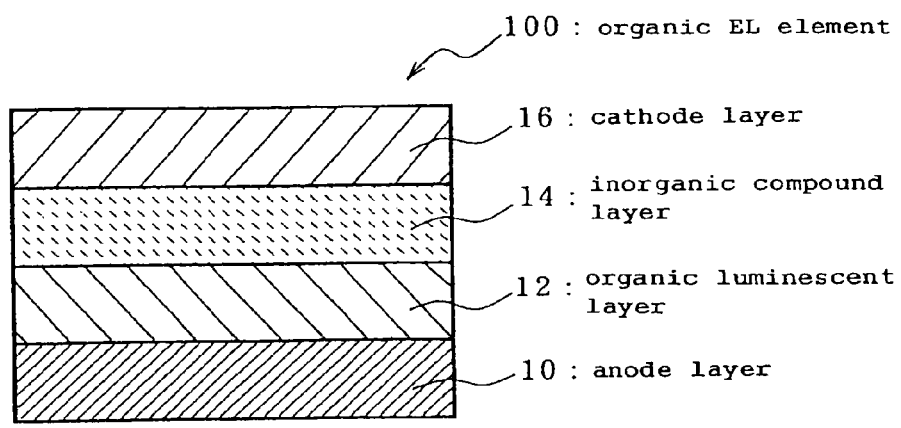
FIG. 1 is a sectional view of an organic EL element according to a first embodiment.

An embodiment of the present invention will be explained with reference to the drawings. These drawings diagrammatically show the sizes, shapes and positions of constituent members for easy understanding of the present invention. The present invention is not thus limited to the drawings. In the drawings, hatching representing a section may be omitted.

First Embodiment

A first embodiment of the organic EL element according to the present invention will be described with reference to FIG. 1. FIG. 1 is a sectional view of an organic EL element 100, showing the structure of an anode layer 10, an organic luminescent layer 12, an inorganic compound layer 14 and a cathode layer 16 laminated on a substrate (not shown) in this order.

Here, the organic luminescent layer 12 and inorganic compound layer 14 will be mainly described since they are features of the first embodiment. The other members such as the anode layer 10 and cathode layer 16 will be briefly described about their structures and manufacturing methods. For the members particularly not described, they can be of structure known in the art and manufactured by methods known in the art.

(1) Organic Luminescent Layer (i) Materials 1

The above-mentioned aromatic amine compounds of the formulas (1) and (2) are used in an organic luminescent layer. The use of such aromatic amine compounds allows excellent luminance at low voltages, e.g., about 10V when an inorganic compound layer is provided.

Further, the aromatic amine compounds of the formulas (1) and (2) do not contain any substituent with a styryl group or an alkenyl group. By not containing such a substituent, the half-life of the organic EL element can be extended.

If $Ar^1$ and $Ar^2$ are the same in the formula (1), the compounds of the formula (1) can be of symmetric structure. Similarly if $Ar^3$ and $Ar^5$ are the same and $Ar^4$ and $Ar^6$ are the same in the formula (2), the compounds of the formula (2) can be of symmetric structure.

By containing such a symmetric compound, the half-life can be remarkably extended.

Condensed aromatic rings contained in the compounds of the formulas (1) and (2) are at least three condensed aromatic rings having a bone structure such as pyrene, perylene, anthracene, fluoranthene, chrycene, rubicene, tetracene, pentacene, tetrabenzophenanthrene, tetrabenzanthracene, tetrabenzofluorene, benzoperylene, dibenzopyrene, dibenzochrycene, dibenzoperylene, benzotetracene, decacyclene, acenaphthofluoranthene and dibenzofluoranthene.

Preferable bone structures include pyrene, perylene, anthracene, fluoranthene, chrycene, rubicene, tetracene, pentacene, tetrabenzophenanthrene, tetrabenzanthracene, tetrabenzofluorene, benzoperylene, dibenzopyrene, dibenzochrycene, dibenzoperylene, benzotetracene, decacyclene, acenaphthofluoranthene and dibenzofluoranthene.

(ii) Materials 2

The above-mentioned aromatic amine compounds of the formulas (1) and (2) may preferably have a substituent such as cyano groups, halogen groups, linear, branched or cyclic alkyl groups, linear, branched or cyclic alkoxy groups, substituted or unsubstituted aryl groups, substituted or unsubstituted aryloxy groups, COOR wherein R represents a hydrogen atom, an alkyl group, an aryl group or an aralkyl group, and substituted or unsubstituted arylthio groups.

Preferable substituents include halogen groups such as fluorine atom, chlorine atom and the like; linear, branched or cyclic $C_{1-8}$ alkyl groups such as methyl group, ethyl group, n-propyl group, isopropyl group, n-butyl group, isobutyl group, tert-butyl group, n-pentyl group, isopentyl group, neopentyl group, tert-pentyl group, n-hexyl group, cyclohexyl group, n-heptyl group, cyclohexylmethyl group, n-octyl group, tert-octyl group, 2-ethylhexyl group and the like; linear, branched or cyclic $C_{1-8}$ alkoxy groups such as methoxy group, ethoxy group, n-propoxy group, isopropoxy group, n-butoxy group, isobutoxy group, n-pentyloxy group, isopentyloxy group, neopentyloxy group, n-hexyloxy group, cyclohexyloxy group, n-heptyloxy group, cyclohexylmethyloxy group, n-octyloxy group, 2-ethylhexyloxy group and the like; substituted or unsubstituted $C_{6-10}$ aryl groups such as phenyl group, 2-methylphenyl group, 3-methylphenyl group, 4-methylphenyl group, 4-ethylphenyl group, 4-n-propylphenyl group, 4-tert-butylphenyl group, 2-methoxyphenyl group, 4-methoxyphenyl group, 3-ethoxyphenyl group, 3-fluorophenyl group, 4-chlorophenyl group, 1-naphtyl group, 2-naphtyl group and the like; COOR wherein R represents a hydrogen atom; a linear, branched or cyclic $C_{1-8}$ alkyl group such as methyl group, ethyl group, n-propyl group, isopropyl group, n-butyl group, isobutyl group, tert-butyl group, n-pentyl group, isopentyl group, neopentyl group, tert-pentyl group, n-hexyl group, cyclohexyl group, n-heptyl group, cyclohexylmethyl group, n-octyl group, tert-octyl group, 2-ethylhexyl group and the like; a substituted or unsubstituted $C_{6-10}$ aryl group such as phenyl group, 2-methylphenyl group, 3-methylphenyl group, 4-methylphenyl group, 4-ethylphenyl group, 4-n-propylphenyl group, 4-tert-butylphenyl group, 2-methoxyphenyl group, 4-methoxyphenyl group, 3-ethoxyphenyl group, 3-fluorophenyl group, 4-chlorophenyl group, 1-naphtyl group, 2-naphtyl group and the like; or a substituted or unsubstituted $C_{7-10}$ aralkyl group such as benzyl group, phenethyl group, 2-methylbenzyl group, 3-methylbenzyl, 4-methylbenzyl group, 3-fluorobenzyl group, 2-chlorobenzyl group, 4-chlorobenzyl group, 4-methoxybenzyl group and the like.

Preferable aromatic amine compounds of the formulas (1) and (2) include:

(5)

9,10-bis[4'(di-p-tolylamino)phenyl]anthracene (6)

5,6,11,12-tetrakis[4'-(diphenylamino)phenyl]naphthacene

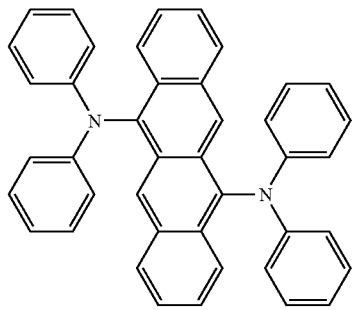

(7)

5,11-bis(diphenylamino)tetracene

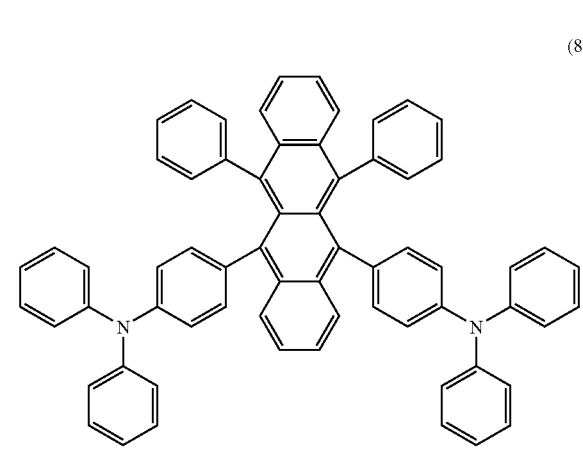

(8)

5,6-diphenyl-11,12-bis[4'-(diphenylamino)phenyl]naphthacene

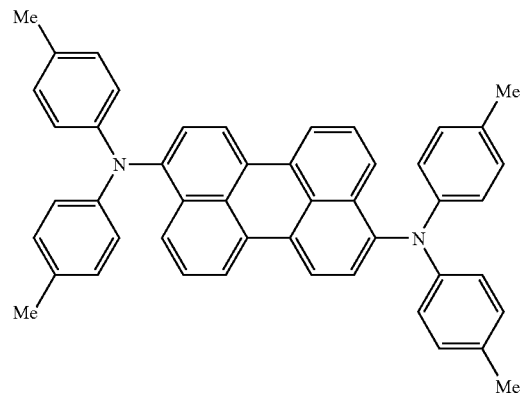

(9)

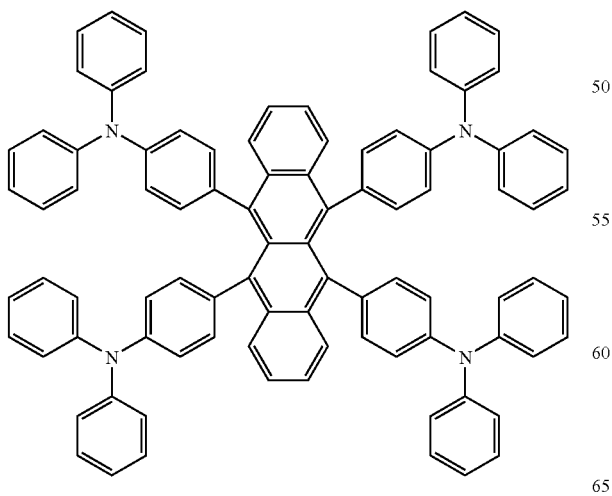

3,9-bis(di-p-tolylamino)perylene
(10)
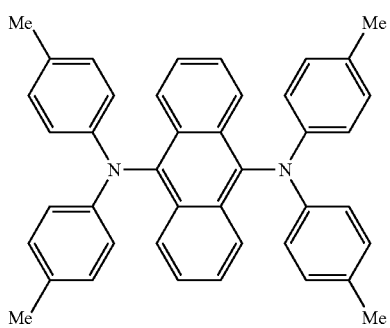
9,10-bis(di-p-tolylamino)anthracene
(11)
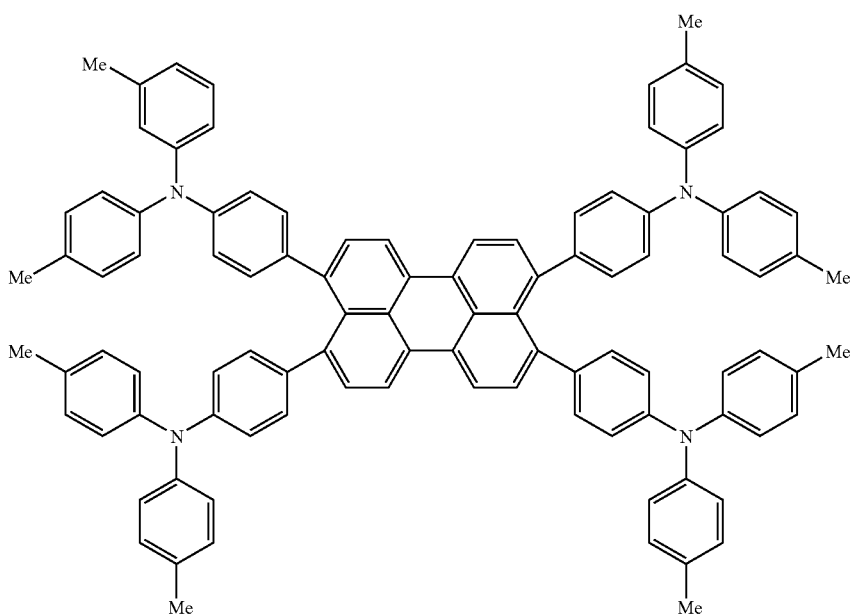
3,4,9,10-tetrakis[4'-(di-p-tolylamino)phenyl]perylene
(12)
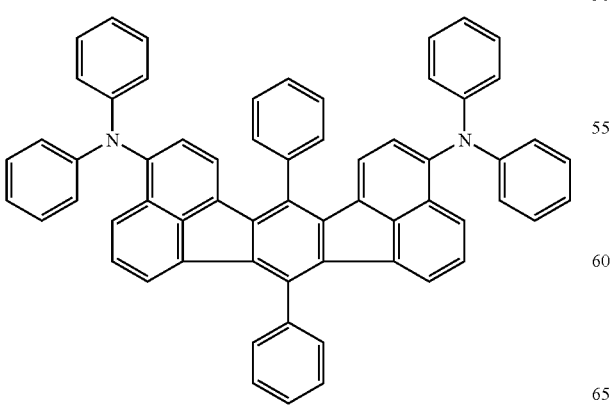

3,11-bis(diphenylamino)-7,14-diphenyl-acenaphtho (1,2-k)fluoranthene

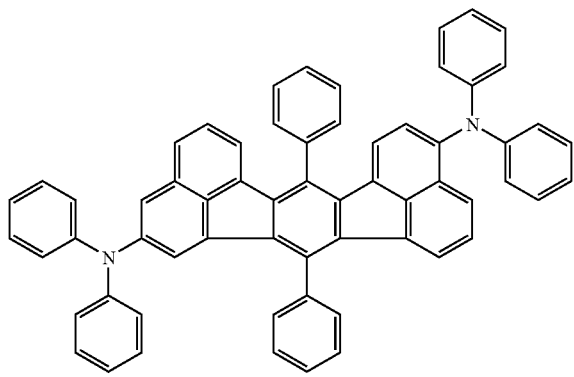

(13)

3,10-bis(diphenylamino)-7,14-diphenyl-acenaphtho (1,2-k)fluoranthene

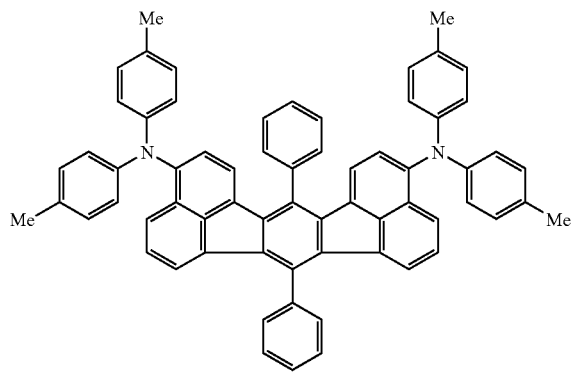

(14)

3,11-bis(di-p-tolylamino)-7,14-diphenyl-acenaphtho (1,2-k)fluoranthene

The aromatic amine compounds of the above formulas (5) to (14) are referred to as compounds 1 to 10 in Examples, respectively.

(iii) Electron Mobility

The electron mobility of an organic luminescent material in an organic luminescent layer is preferably $1 \times 10^{-7}$ cm$^2$/V·s or more. If less than $1 \times 10^{-7}$ cm$^2$/V·s, a high-speed response in an organic EL element may become difficult and its luminance may decrease.

The electron mobility of an organic luminescent material is more preferably in the range of $1.1 \times 10^{-7}$ to $2 \times 10^{-6}$ cm$^2$/V·s, and still more preferably $1.2 \times 10^{-7}$ to $1.0 \times 10^{-6}$ cm$^2$/V·s.

The electron mobility of an organic luminescent material is preferably smaller than the positive hole mobility thereof. Otherwise organic luminescent materials usable for an organic luminescent layer may be unduly limited, and luminance may decrease.

Further, the electron mobility of an organic luminescent material is preferably greater than $\frac{1}{1,000}$ of the positive hole mobility thereof. If the electron mobility is excessively small, it may be difficult for electrons to recombine with positive holes around the center of an organic luminescent layer, thereby resulting in a decrease in luminance.

Therefore, the relationship between the positive hole mobility ($\mu_h$) and the electron mobility ($\mu_e$) of an organic luminescent material should preferably satisfy the inequality of $\mu_h/2 > \mu_e > \mu_h/500$, and more preferably $\mu_h/3 > \mu_e > \mu_h/100$.

(iv) Additives

A luminescent or fluorescent dopant is preferably added in an organic luminescent layer.

Examples of the luminescent or fluorescent dopants include fluorescent whitening agents such as benzothiazoles, benzoimidazoles and benzooxazoles; styrylbenzene compounds; and metal complexes having an 8-quinolinol derivative as a ligand.

Further, a luminescent or fluorescent aromatic amine compound other than the aromatic amine compounds of the formulas (1) and (2) is preferably added in an organic luminescent layer.

Examples of the luminescent or fluorescent aromatic amine compounds include 2,7-bis(diphenylamino)naphthalene, and 2,7-bis[4'-(di-p-tolylamino)phenyl]naphthalene.

(v) Methods of Formation

Although a method of forming an organic luminescent layer is not specifically limited, well-known methods such as a deposition method, spin coating method, casting method and LB method may be employed.

For example, a binding agent such as resins and an organic luminescent material are dissolved in a solvent to obtain a solution and the solution is then formed into a thin film by spin-coating, thereby obtaining an organic luminescent layer.

(vi) Thickness

The thickness of an organic luminescent layer is not specifically limited and may be appropriately selected depending on conditions. For example, preferable thickness is 5 nm to 5 μm. If the thickness is less than 5 nm, luminance and durability may be impaired. If more than 5 μm, the applied voltage may increase.

In view of the foregoing, the thickness is more preferably 10 nm to 3 μm, and still more preferably 20 nm to 1 μm.

(2) Inorganic Compound Layer

In the first embodiment, an organic EL element superior in electron injection from an anode and durability can be obtained by the provision of an inorganic compound layer. Further, an organic EL element with the high luminance at low driving voltages and remarkably long life can be obtained by combining the above-mentioned certain organic luminescent layer with the inorganic compound layer.

(i) Materials

Insulative materials and semiconductive materials are preferably used as an inorganic compound of an inorganic compound layer.

At least one metallic compound selected from the group consisting of chalcogenides of alkali metals, chalcogenides of alkaline-earth metals, halides of alkali metals, halides of alkaline-earth metals is preferably used as an insulative material.

Specifically, suitable chalcogenides of alkali metals include $Li_2O$, $LiO$, $Na_2S$, $Na_2Se$ and $NaO$. Suitable chalcogenides of alkaline-earth metals include $CaO$, $BaO$, $SrO$, $BeO$, $BaS$ and $CaSe$. Suitable halides of alkali metals include LiF, NaF, KF, LiCl, KCl and NaCl. Suitable halides of alkaline-earth metals include fluorides such as $CaF_2$, $BaF_2$, $SrF_2$, $MgF_2$ and $BeF_2$ and halides other than fluorides.

Semiconductive materials constituting an inorganic compound layer include one or more of oxides, nitrides, and oxidized nitrides containing at least one element selected from the group consisting of Ba, Ca, Sr, Yb, Al, Ga, In, Li, Na, Cd, Mg, Si, Ta, Sb and Zn.

Fine crystalline or amorphous insulative materials are more preferably used as an inorganic compound of an inorganic compound layer. If the inorganic compound layer is made of such an insulative material, more uniform thin film can be formed, thereby reducing pixel defectives such as dark spots.

Examples of fine crystalline or amorphous insulative material include the above-mentioned chalcogenides and halides of alkali metals and alkaline-earth metals.

In order to give conductivity to an inorganic compound layer and enable the operation of an organic EL element at low voltages, a conductive compound is preferably added to the inorganic compound layer in amount of 1 to 20% by weight of the total inorganic compound layer.

(ii) Electron Affinity

In the first embodiment, the electron affinity of an inorganic compound layer is preferably 1.8 to 3.6 eV. If the electron affinity is less than 1.8 eV, the electron injection property decreases, resulting in higher driving voltages and lower luminous efficiency. If the electron affinity is more than 3.6 eV, a complex with a low luminous efficiency tends to be produced.

The electron affinity is more preferably from 1.9 to 3.0 eV, still more preferably from 2.0 to 2.5 eV.

In addition, it is desirable that the difference between the electron affinity of an inorganic compound layer and that of an organic luminescent layer be 1.2 eV or less, and more preferably 0.5 eV or less. The smaller the difference in electron affinity, the easier the electron injection from an electron injection layer into an organic luminescent layer, allowing a high-speed response of an organic EL element.

(iii) Energy Gap

In the first embodiment, it is desirable that the energy gap (bandgap energy) of an inorganic compound layer be 2.7 eV or more, and more preferably 3.0 eV or more.

If the energy gap is greater than 2.7 eV, less positive holes move to an inorganic compound layer through an organic luminescent layer. The recombining efficiency of positive holes and electrons is thus improved, resulting in an increase in the luminance of an organic EL element and avoiding the luminescence of an electron injection layer and the like.

(iv) Structure

The structure of an inorganic compound layer is not specially limited. It may be of mono-layer, two-layer or three-layer structure.

Although the thickness of an inorganic compound layer is not specifically limited, this thickness is preferably, for example, 0.1 nm to 1,000 nm. If the thickness is less than 0.1 nm, the electron injection property may decrease or the mechanical strength may be impaired. If the thickness is more than 1,000 nm, the resistance is too high so that a high-speed response may not be obtained in an organic EL element and it may take longer time to form the layer.

In view of the foregoing, the thickness is more preferably from 0.5 to 100 nm, and still more preferably from 1 to 50 nm.

(v) Methods of Forming

A method of forming an inorganic compound layer is not specifically limited as far as a thin layer with a uniform thickness is obtained. Known methods such as a vacuum deposition method, spin coating method, casting method and LB method can be employed.

(3) Electrodes (i) Anode Layer

As an anode layer, metals, alloys, electrically conductive compounds with a large work function (for example, 4.0 eV or more), or mixtures thereof may be used. Specifically, indium tin oxide (ITO), indium copper, tin, zinc oxide, gold, platinum, palladium and the like may be used either individually or in combination of two or more.

Although the thickness of an anode layer is not specifically limited, the thickness is preferably 10 to 1,000 nm, and more preferably 10 to 200 nm.

Furthermore, in order to effectively remove light emitted from an organic luminescent layer, an anode layer is preferably substantially transparent. Specifically, the anode layer has light transmittance of 10% or more.

(ii) Cathode Layer

As a cathode layer, metals, alloys, electric conductive compounds with a small work function (for example, less than 4.0 eV), or mixtures thereof may be used. Specifically, magnesium, aluminum, indium, lithium, sodium, cesium, silver and the like may be used either individually or in combination of two or more.

Although the thickness of a cathode layer is not specifically limited, the thickness is preferably 10 to 1,000 nm, and more preferably 10 to 200 nm.

Furthermore, in order to effectively remove light emitted from an organic luminescent layer, the cathode layer is preferably substantially transparent. Specifically, the cathode layer has light transmittance of 10% or more.

(4) Positive Hole Injecting/Transport Layer

In the first embodiment, although not shown, a positive hole injecting/transport layer is preferably provided between an anode and an organic luminescent layer. By this injecting/transport layer, positive holes can be smoothly injected and the injected holes can be efficiently transported. Thus the injecting/transport layer facilitates the injection of positive holes and the transportation thereof to the organic luminescent layer, allowing high response of an organic EL element.

The positive hole injecting/transport layer is preferably formed of an organic or inorganic material. Preferable organic materials include phthalocyanine compounds, diamine compounds, diamine contained oligomers and thiophene contained oligomers. Preferable inorganic materials include amorphous silicon ($\alpha$-Si), $\alpha$-SiC, microcrystal silicon ($\mu$ C—Si), $\mu$ C—SiC, II-VI group compounds, III-V group compounds, amorphous carbon, crystalline carbon and diamond.

(5) Sealing Layer

Although not shown in FIG. 1, there is preferably provided a sealing layer so as to entirely cover an organic EL element to prevent water and oxygen from penetrating to the organic EL element.

Preferable materials of the sealing layer include copolymers of tetrafluoroethylene and a monomer mixture containing at least one monomer; fluororine-containing-copolymers with a ring structure in the main chain; polyethylene, polypropylene, polymethyl methacrylate, polyimide, polyurea, polytetrafluoroethylene, polychlorotrifluoroethylene, polydichlorodifluoroethylene and copolymers of chlorotrifluoroethylene and dichlorodifluoroethylene; aqueous absorbent materials of which the water absorption ratio is 1% or more; dampproof materials of which the water absorption ratio is 0.1% or less; metals such as In, Sn, Pb, Au, Cu, Ag, Al, Ti and Ni; metal oxides such as MgO, SiO, $SiO_2$, GeO, NiO, CaO, BaO, $Fe_2O$, $Y_2O_3$, $TiO_2$; metal fluorides such as $MgF_2$, LiF, $AlF_3$, $CaF_2$; liquid fluoridized carbons such as perfluoroalkane, perfluoroamine and perfluoropolyether; and compositions where absorbents capable of absorbing water and oxygen are dispersed in the liquid fluoridized carbons.

Second Embodiment

Figure 2:
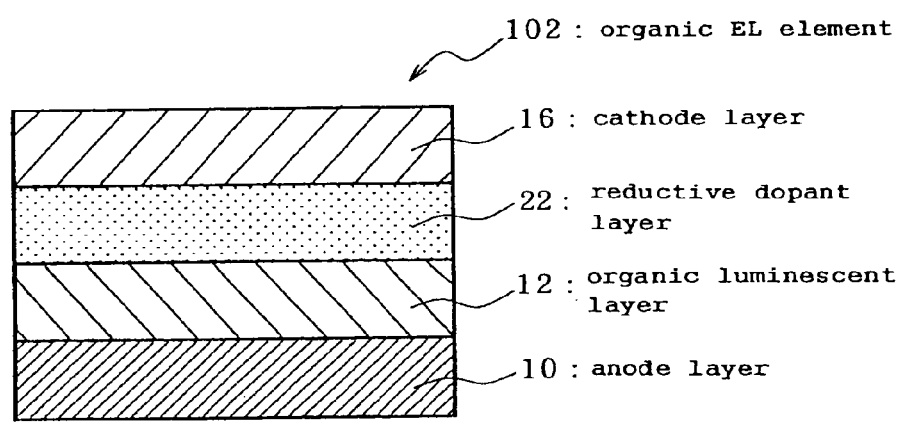
FIG. 2 is a sectional view of an organic EL element according to a second embodiment.

A second embodiment of the organic EL element according to the present invention will be described with reference to FIG. 2. FIG. 2 is a sectional view of an organic EL element 102, showing the structure of an anode layer 10, an organic luminescent layer 12, a reductive dopant layer 22 and a cathode layer 16 laminated in this order.

Such reductive dopant layer (hereinafter may referred to as an interface layer) functions to enhance the ability of injecting electrons. Thus, due to the provision of the reductive dopant layer, electrons can be easily injected or transported to the organic luminescent layer, thereby allowing high-speed response of the organic EL element.

The reductive dopant layer, which is a feature of the second embodiment, will be mainly described. The other members such as the organic luminescent layer can be of structure similar to the first embodiment.

(1) Materials

Any reductive dopants which have the reductivity to aromatic compounds can be used. A preferred reductive dopant is, but not limited to, at least one material selected from the group consisting of alkali metals, alkaline-earth metals, rare-earth metals, oxides of alkali metals, halides of alkali metals, oxides of alkaline-earth metals, halides of alkaline-earth metals, oxides of rare-earth metals, and halides of rare-earth metals.

Preferred alkali metals include Li (work function: 2.93 eV), Na (work function: 2.36 eV), K (work function: 2.3 eV), Rb (work function: 2.16 eV) and Cs (work function: 1.95 eV). Here, the values of work function put in parentheses are cited from "Chemical Handbook (Basis II, p. 493, edited by Japanese Chemical Society). The values shown below are similarly cited therefrom.

Preferred alkaline-earth metals include Ca (work function: 2.9 eV), Mg (work function: 3.66 eV), Sr (work function: 2.0 to 2.5 eV) and Ba (work function: 2.52 eV). The value of work function of Sr is cited from Physics of Semicondutor Device (N. Y. Wylow 1969, p. 366).

Preferred rare-earth metals include Yb (work function: 2.6 eV), Eu (work function: 2.5 eV), Gd (work function: 3.1 eV) and En (work function: 2.5 eV).

Preferred oxides of alkali metals include LiF, $Li_2O$, LiO, NaF and NaO.

Preferred oxides of alkaline-earth metals include CaO, BaO, SrO, BeO, MgO and mixtures thereof such as $Ba_xSr_{1-x}O$ (0<X<1) and $Ba_xCa_{1-x}O$ (0<X<1).

Preferred halides of alkali metals include LiCl, KCl and NaCl as well as fluorides such as LiF, NaF and KF. Preferred halides of alkaline-earth metals include fluorides such as $CaF_2$, $BaF_2$, $SrF_2$, $MgF_2$ and $BeF_2$, and other halides.

Further, preferred reductive dopants include metal complexes where an aromatic compound is coordinated on an alkali metal. For example, such metal complexes include compounds represented by the following formula (15).

$$A^+Ar^{7-} \tag{15}$$

wherein A is an alkali metal and $Ar^7$ is an aromatic compound having 10 to 40 carbon atoms.

Examples of aromatic compounds in the metal complexes of formula (15) include anthracene, naphthalene, diphenylanthracene, terphenyl, quaterphenyl, quinquephenyl, sexiphenyl, quinolinol, benzoquinolinol, acridinol, hydroxyphenyloxazole, hydroxyphenylthiazole, hydroxydiaryloxadiazole, hydroxydiarylthiadiazole, hydroxyphenylpyridine, hydroxyphenylbenzimidazole, hydroxybenzotriazole, hydroxy fluborane, bipyridyl, phenanthroline, phthalocyanine, porphyrin and derivatives thereof.

If such aromatic compounds have a hydroxyl group, they are coordinated in the state where $A^+$ is changed to H (proton) of the hydroxyl group.

The additional amount of a reductive dopant is 0.01% or more of total weight of all materials constituting a reductive dopant layer.

If the amount is less than 0.01 wt. %, the additional effect of the dopant may not be obtained, that is, the luminance of an organic EL element may be reduced or the life thereof may be shortened.

Thus, in view of balance of luminance and life, the amount of the reductive dopant is preferably 0.2 wt. % or more.

The reductive dopant can be used alone and placed in the interface of a cathode layer and an organic luminescent layer.

In cases that a mixture of a reductive dopant and an aromatic compound is used in a reductive dopant layer, the mixture ratio of the dopant to the compound is preferably 1:20 to 20:1 (mole ratio).

If the ratio is outside the range, the luminance of an organic EL element may be reduced or the life thereof may be shortened.

More preferably the ratio is 1:10 to 10:1, still more preferably 1:5 to 5:1.

(2) Structure

The reductive dopant layer may be preferably of monolayer or multi-layer structure.

The thickness of the reductive dopant layer is not limited. In cases where a mixture of a reductive dopant and an aromatic compound is used, the thickness is preferably 0.1 to 15 nm, more preferably 0.1 to 8 nm. In cases where a reductive dopant is used alone, it is preferably 0.05 to 3 nm, more preferably 0.1 to 1 nm.

Further, a reductive dopant layer may be uniformly or non-uniformly dispersed to form an island-like reductive dopant layer as a discontinuous layer or a continuous reductive dopant layer with an uniform or non-uniform thickness.

(3) Methods of Formation

As an example of preferred method of forming a reductive dopant layer, while depositing a reductive dopant, e.g., by a resistance heating deposition method, an aromatic compound, a luminescent material and an electron injection material, which constitute an interface region, are simultaneously deposited. As a result, the reductive dopant is dispersed in these materials.

Third Embodiment

Figure 3:
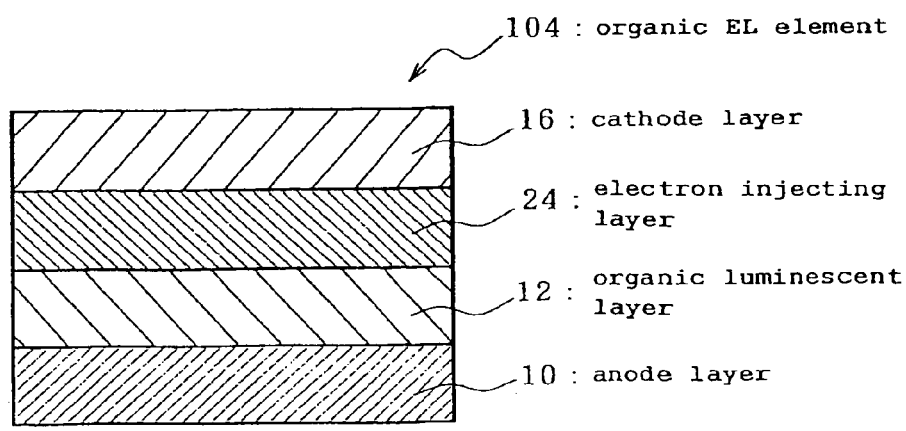
FIG. 3 is a sectional view of an organic EL element according to a third embodiment.

A third embodiment of the organic EL element according to the present invention will be described with reference to FIG. 3. FIG. 3 is a sectional view of an organic EL element 104, showing the structure of an anode layer 10, an organic luminescent layer 12, an electron injecting layer 24 and a cathode layer 16 laminated in this order.

The electron injecting layer comprises a hydrocarbon compound with an anthracene nucleus or a fluoranthene nucleus. The energy gap of the compound is 2.7 eV or more. Further, the organic luminescent layer comprises an aromatic amine compound represented by the formula (3) and/or an aromatic amine compound represented by the formula (4). The aromatic amine compounds of the formulas (3) and (4) are compounds which are represented by the formulas (1) and (2) but may contain a styryl group and an alkenyl group. The above-stated description and examples on the aromatic amine compounds of the formulas (1) and (2) can be applied to the aromatic amine compounds of the formulas (3) and (4).

The electron injecting layer and organic luminescent layer will be mainly described since they are features of the third embodiment. The other members can be of structure similar to the first and second embodiments.

(1) Electron Injecting Layer (i) Materials

Hydrocarbon compounds with an anthracene nucleus or a fluoranthene nucleus of which energy gap is 2.7 eV or more are used in an electron injecting layer. If the energy gap of a hydrocarbon compounds is less than 2.7 eV, the hydrocarbon compound emits light, resulting a decrease in luminous efficiency of an organic EL element.

The reason for the use of the hydrocarbon compounds with an anthracene nucleus or a fluoranthene nucleus is that electrons can easily move in the compounds to enhance the luminous efficiency of an organic EL element.

Suitable compounds with an anthracene nucleus include compounds represented by the formula (16).

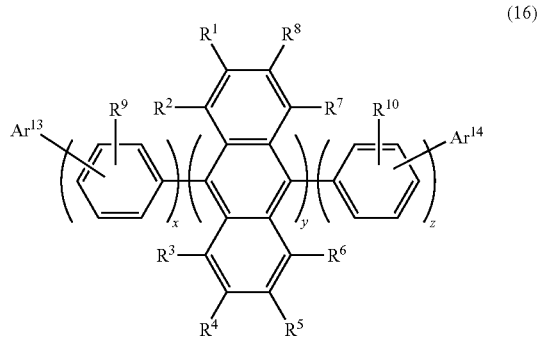

(16)

wherein $R^1$ to $R^{10}$ are independently a hydrogen atom, a halogen atom, a substituted or unsubstituted $C_{1-20}$ alkyl group, a substituted or unsubstituted $C_{1-20}$ alkoxy group, a substituted or unsubstituted $C_{6-30}$ aryloxy group, a substituted or unsubstituted $C_{1-20}$ alkylthio group, a substituted or unsubstituted $C_{6-30}$ arylthio group, a substituted or unsubstituted $C_{7-30}$ arylalkyl group, a unsubstituted $C_{5-30}$ monocyclic group, a substituted or unsubstituted $C_{10-30}$ condensed polycyclic group, or a substituted or unsubstituted $C_{5-30}$ heterocyclic group; $Ar^{13}$ and $Ar^{14}$ are independently a substituted or unsubstituted $C_{6-30}$ aryl group, the substituent of the aryl group is a substituted or unsubstituted $C_{1-20}$ alkyl group, a substituted or unsubstituted $C_{1-20}$ alkoxy group, a substituted or unsubstituted $C_{6-30}$ aryloxy group, a substituted or unsubstituted $C_{1-20}$ alkylthio group, a substituted or unsubstituted $C_{6-30}$ arylthio group, a substituted or unsubstituted $C_{7-30}$ arylalkyl group, a unsubstituted $C_{5-30}$ monocyclic group, a substituted or unsubstituted $C_{10-30}$ condensed polycyclic group, a substituted or unsubstituted $C_{5-30}$ heterocyclic group, or a substituted or unsubstituted $C_{4-40}$ alkenyl group; x and z are an integer of 0 to 3; and y is an integer of 1 to 2.

Suitable compounds with a fluoranthene nucleus include compounds represented by the formula (17).

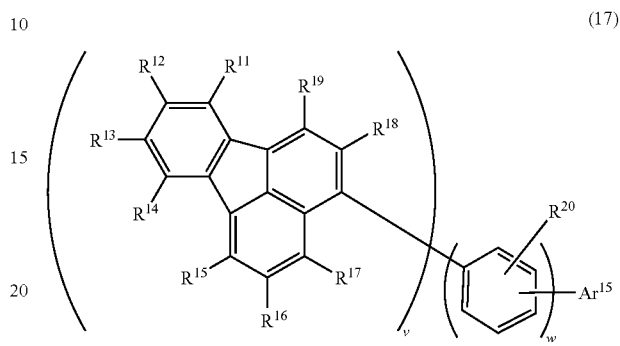

(17)

wherein $R^{11}$ to $R^{20}$ and $Ar^{15}$ are the same as $R^1$ to $R^{10}$ and $Ar^{13}$ and $Ar^{14}$ of the formula (16), respectively; and v and w are an integer of 1 to 3.

(ii) Thickness

The thickness of an electron injecting layer is not limited. However, it is preferably 1 to 50 nm, more preferably 2 to 30 nm, still more preferably 3 to 25 nm.

If the thickness is less than 1 nm, the property of electron injection may not be improved, whereas if it is more than 50 nm, the luminous efficiency of an organic EL element may be decreased or the half life thereof may be shortened.

(2) Organic Luminescent Layer

The aromatic amine compounds represented by the formulas (3) and (4) are used in an organic luminescent layer. The reason for the use of the compounds with at least three condensed aromatic rings is that excellent luminance can be obtained at voltages as low as about 10 V in cases where an electron injecting layer is provided.

Further, even in cases where the above aromatic amine compounds contain a styryl or alkenyl group as a substituent, if the above-mentioned hydrocarbon compounds of certain structure are used in an electron injecting layer, the half life is remarkably extended.

Materials, electron mobility, additives, methods of formation and thickness of the organic luminescent layer in the third embodiment are the same as those of the first embodiment.

EXAMPLES

Example 1

(1) Formation of Organic EL Element

A transparent electrode with a thickness of 75 nm was formed from indium tin oxide (ITO) as an anode layer on a transparent glass substrate with a dimension of thickness: 1.1 mm×length: 25 mm×width: 75 mm. The resultant substrate was ultrasonically washed in isopropyl alcohol, dried in a nitrogen gas atmosphere, and washed for 10 minutes using UV (ultraviolet radiation) and ozone.

Next, the substrate with the transparent electrode was placed on a substrate holder in a deposition vessel of a vacuum deposition device. After reducing the pressure in the vacuum vessel to 1×10⁻³ Pa, a positive hole injecting layer, an organic luminescent layer, an inorganic compound layer and a cathode were sequentially laminated on the anode layer to form an organic EL element under the following deposition conditions.

Positive Hole Injecting Layer:
4,4'-bis-(N,N-di-m-tolylamino)-4''-phenyl-triphenylamine (TPD74)
Deposition rate: 0.2 nm/sec.
Thickness: 80 nm Organic Luminescent Layer:
3,11-bis(diphenylamino)-7,14-diphenyl-acenaphtho(1,2-k)fluoranthene (Compound 8)
Deposition rate: 0.2 nm/sec.
Thickness: 50 nm Inorganic Compound Layer:
LiF
Deposition rate: 0.2 nm/sec.
Thickness: 1 nm Cathode Layer:
Al
Deposition rate: 0.2 nm/sec.
Thickness: 200 nm (2) Evaluation of Organic EL Element A DC voltage of 6 V was applied between the cathode layer and the anode layer of the organic EL element thus obtained. The luminance was 540 cd/cm² and the emitted color was orange.

Furthermore, when the organic EL element was driven at a constant current on condition that the initial luminance was 500 cd/cm², the half-life was 3,200 hours. The results were shown in Table 1.

Examples 2 to 6

In Examples 2 to 6, organic EL elements were formed in a manner similar to that of Example 1 except that the compound 5 (Example 2), the compound 6 (Example 3), the compound 9 (Example 4), the compound 10 (Example 5) and the compound 1 (Example 6) were used instead of the compound 8 of Example 1. A DC voltage of 5.5 V or 6 V was applied between a cathode layer and an anode layer for evaluation.

As a result, color of emitted light as shown in Table 1 was observed, luminance was 310 to 720 cd/m² and half-life was 2,100 to 3,700 hours.

The results obtained were shown in Table 1.

TABLE 1

|  | Example 1 | Example 2 | Example 3 | Example 4 | Example 5 | Example 6 |
|---|---|---|---|---|---|---|
| positive hole injecting layer | TPD74 | TPD74 | TPD74 | TPD74 | TPD74 | TPD74 |
| luminescent material | compound 8 | compound 5 | compound 6 | compound 9 | compound 10 | compound 1 |
| inorganic compound layer | LiF | LiF | LiF | LiF | LiF | LiF |
| driving voltage(V) | 6 | 5.5 | 5.5 | 5.5 | 5.5 | 6 |
| color of emitted light | orange | green | green | orange | red orange | blue green |
| luminance (cd/m²) | 540 | 620 | 310 | 460 | 720 | 540 |
| half-life (hour) | 3,200 | 3,000 | 2,500 | 2,100 | 3,700 | 3,200 |

Comparative Examples 1 to 3

In Comparative Examples 1 to 3, organic EL elements were formed in a manner similar to that of Example 1 except that an electron transport layer with a thickness of 20 nm was formed from tris(8-hydroxyquinolinate)aluminum (Alq) instead of the inorganic compound layer of Example 1; and the compound 1 (Comparative Example 1), the compound 6 (Comparative Example 2) and the compound 4 (Comparative Example 3) were used as a luminescent material. A DC voltage of 5.5 V was applied between a cathode layer and an anode layer for evaluation.

As a result, color of emitted light as shown in Table 2 was observed, luminance was 250 to 470 cd/m² and half-life was 700 to 1,600 hours. The results obtained were shown in Table 2.

TABLE 2

|  | Comparative Example 1 | Comparative Example 2 | Comparative Example 3 |
|---|---|---|---|
| positive hole injecting layer | TPD74 | TPD74 | TPD74 |
| luminescent material | compound 1 | compound 6 | compound 9 |
| electron injecting layer | Alq | Alq | Alq |
| driving voltage (V) | 5.5 | 5.5 | 5.5 |
| color of emitted light | orange | green | orange |
| luminance (cd/m²) | 470 | 250 | 320 |
| half-life (hour) | 1,600 | 1,300 | 700 |

Example 7

In Example 7, a organic EL element was formed in a manner similar to that of Example 1 except that an interface layer (reductive dopant layer) with a thickness of 20 nm was formed from a mixture of the compound 1 and metal lithium (Li) as a reductive dopant (mixture mole ratio 1:1) instead of the inorganic compound layer, by using the compound 1 instead of the compound 8 of Example 1. A DC voltage of 5.5 V was applied between a cathode layer and an anode layer for evaluation.

As a result, orange light was observed, luminance was 610 cd/m$^2$ and half-life was 2,800 hours. The results obtained were shown in Table 3.

Example 8

In Example 8, a organic EL element was formed in a manner similar to that of Example 1 except that an interface layer (reductive dopant layer) with a thickness of 1 nm was formed at an interface area from a lithium metal complex of the following formula (18) (hereinafter referred to as a compound 11) as a reductive dopant instead of the inorganic compound layer, by using the compound 1 instead of the compound 8 of Example 1. A DC voltage of 6.5 V was applied between a cathode layer and an anode layer for evaluation.

As a result, blue green light was observed, luminance was 530 cd/m$^2$ and half-life was 3,300 hours. The results obtained were shown in Table 3.

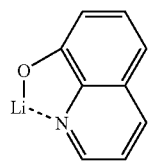

(18)

Example 9

In Example 9, a organic EL element was formed in a manner similar to that of Example 8 except that an interface layer (reductive dopant layer) with a thickness of 1 nm was formed from a mono(2,2,6,6-tetramethyl-3,5-heptanedionate)lithium complex (Li(dpm)) instead of the reductive dopant of Example 8. A DC voltage of 6.5 V was applied between a cathode layer and an anode layer for evaluation.

As a result, orange light was observed, luminance was 470 cd/m$^2$ and half-life was 3,000 hours. The results obtained were shown in Table 3.

Example 10

In Example 10, a organic EL element was formed in a manner similar to that of Example 8 except that an interface layer (reductive dopant layer) with a thickness of 5 nm was formed from a mixture of the compound 1 and Li(dpm) as a reductive dopant (mixture mole ratio 1:1) instead of the reductive dopant of Example 8 as a luminescent material. A DC voltage of 6.5 V was applied between a cathode layer and an anode layer for evaluation.

As a result, orange light was observed, luminance was 580 cd/m$^2$ and half-life was 3,900 hours. The results obtained were shown in Table 3.

Example 11

In Example 11, a organic EL element was formed in a manner similar to that of Example 1 except that an electron injecting layer with a thickness of 20 nm was formed from a mixture of a phenylanthracene compound of the following formula (19) (hereinafter referred to as a compound 12, energy gap: 3.0 eV) and metal lithium (Li) as a reductive dopant (mixture mole ratio 1:1) instead of the inorganic compound layer of Example 1. A DC voltage of 6.5 V was applied between a cathode layer and an anode layer for evaluation.

As a result, blue green light was observed, luminance was 430 cd/m$^2$ and half-life was 2,600 hours. The results obtained were shown in Table 3.

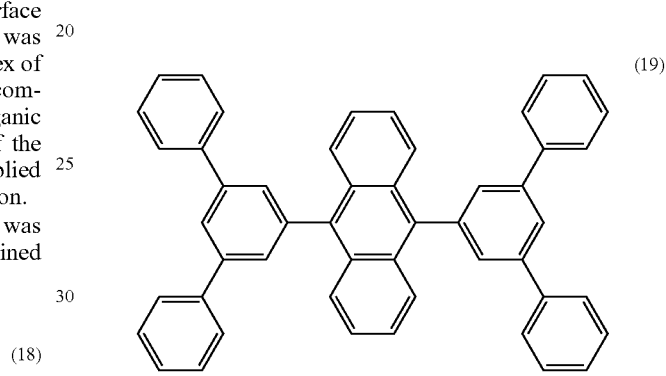

(19)

Example 12

In Example 12, a organic EL element was formed in a manner similar to that of Example 1 except that the compound 1 was used instead of the compound 8 of Example 1, and an electron injecting layer with a thickness of 20 nm was formed from a mixture of a fluoranthene compound of the following formula (20) (hereinafter referred to as a compound 13, energy gap: 2.8 eV) and metal lithium (Li) as a reductive dopant (mixture mole ratio 1:1) instead of the inorganic compound layer of Example 1. A DC voltage of 6.5 V was applied between a cathode layer and an anode layer for evaluation.

As a result, blue green light was observed, luminance was 530 cd/m$^2$ and half-life was 3,800 hours. The results obtained were shown in Table 3.

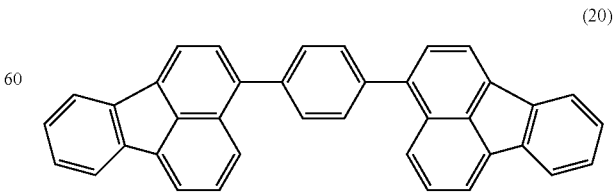

(20)

TABLE 3

| | Example 7 | Example 8 | Example 9 | Example 10 | Example 11 | Example 12 |
|---|---|---|---|---|---|---|
| positive hole injecting layer | TPD74 | TPD74 | TPD74 | TPD74 | TPD74 | TPD74 |
| luminescent material | compound 8 | compound 1 | compound 8 | compound 8 | compound 1 | compound 1 |
| interface layer | compound 1/Li | compound 11 | Li(dpm) | compound 1/Li(dpm) | | |
| electron injecting layer | | | | | compound 12/Li | compound 13/Li |
| driving voltage(V) | 5.5 | 6.5 | 6.5 | 6.5 | 6.5 | 6.5 |
| color of emitted light | orange | blue green | orange | orange | blue green | blue green |
| luminance (cd/m$^2$) | 540 | 530 | 470 | 580 | 430 | 530 |
| half-life (hour) | 3,200 | 3,300 | 3,000 | 3,900 | 2,600 | 3,800 |

INDUSTRIAL UTILITY

As described in detail above, according to the first aspect of the invention, even in cases where an electron injecting layer made of an inorganic compound is provided, by using an aromatic amine compound containing at least three condensed aromatic rings as a luminescent material, electrons can effectively combine positive holes in an organic luminescent layer. Consequently, there could be provided an organic EL element with higher luminance, e.g., 500 cd/m$^2$ or more even at low driving voltages and extremely longer half-life, e.g., more than 2,000 hours.

According to the second aspect of the invention, by arranging a reductive dopant layer and further using an aromatic amine compound containing at least three condensed aromatic rings in an organic luminescent layer, there could be similarly provided an organic EL element with higher luminance even at low driving voltages and extremely longer half-life.

According to the third aspect of the invention, by using a certain hydrocarbon compound in an electron injecting layer and further using an aromatic amine compound containing at least three condensed aromatic rings in an organic luminescent layer, there could be similarly provided an organic EL element with higher luminance even at low driving voltages and extremely longer half-life.

What is claimed is:

1. An organic electroluminescent element, comprising:
   an anode layer;
   an organic luminescent layer;
   a cathode layer; and
   a reductive dopant layer between the organic luminescent layer and the cathode layer;
   wherein:
   the reductive dopant layer comprises a metal complex according to formula (A):

$$A^+ Ar^{7-} \quad (A)$$

wherein:
   A is an alkali metal; and
   Ar$^7$ is an aromatic compound selected from the group consisting of anthracene, naphthalene, diphenylanthracene, terphenyl, quaterphenyl, quinquephenyl, sexiphenyl, quinolinol, benzoquinolinol, acridinol, hydroxyphenyloxazole, hydroxyphenylthiazole, hydroxydiaryloxadiazole, hydroxydiarylthiadiazole, hydroxyphenylpyridine, hydroxyphenylbenzimidazole, hydroxybenzotriazole, hydroxy fluborane, bipyridyl, phenanthroline, phthalocyanine, porphyrin, and derivatives thereof; and the organic luminescent layer comprises at least one of an aromatic amine compound of formula (1) and an aromatic amine compound of formula (2):

(1)

wherein:
   each of A, Ar$^1$ and Ar$^2$ is independently a substituted or unsubstituted C$_{6-60}$ aromatic group that does not contain a styryl group or an alkenyl group;
   at least one of A, Ar$^1$ and Ar$^2$ is a substituted or unsubstituted structure including at least three condensed aromatic rings; and
   p is an integer of 1 to 6;

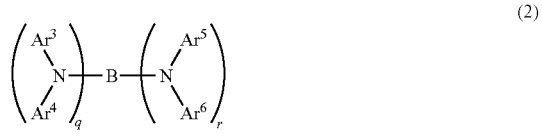

(2)

wherein:
   each of B, Ar$^3$, Ar$^4$, Ar$^5$ and Ar$^6$ is independently a substituted or unsubstituted C$_{6-60}$ aromatic group that does not include a styryl group or an alkenyl group;
   at least one of B, Ar$^3$, Ar$^4$, Ar$^5$ and Ar$^6$ comprises a substituted or unsubstituted structure including at least three condensed aromatic rings;
   each of q and r is independently an integer of 1 to 6.

2. The organic electroluminescent element according to claim 1, wherein the metal complex of the reductive dopant layer is a compound according to formula (B):

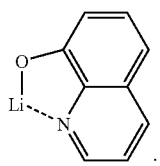 (B)

3. The organic electroluminescent element according to claim 1, wherein the aromatic amine compounds of formula (1) and formula (2) comprise a condensed aromatic ring structure selected from the group consisting of pyrene, perylene, anthracene, fluoranthene, chrycene, rubicene, tetracene, pentacene, tetrabenzophenanthrene, tetrabenzanthracene, tetrabenzofluorene, benzoperylene, dibenzopyrene, dibenzochrycene, dibenzoperylene, benzotetracene, decacyclene, acenaphthofluoranthene and dibenzofluoranthene.

4. The organic electroluminescent element according to claim 1, wherein:
each of $Ar^1$ to $Ar^6$ comprises 6 to 40 carbon atoms; and
each of A and B comprises a substituted or unsubstituted structure including at least three condensed aromatic rings.

5. The organic electroluminescent element according to claim 1, wherein each of $Ar^1$ to $Ar^6$ comprises a group selected from the group consisting of a cyano group, a halogen group, a linear, branched or cyclic alkyl group, a linear, branched or cyclic alkoxy group, a substituted or unsubstituted aryl group, a substituted or unsubstituted aryloxy group, COOR wherein R represents a hydrogen atom, an alkyl group, an aryl group or an aralkyl group, and a substituted or unsubstituted arylthio group.

* * * * *